CURRENT METER EMPLOYING A LOGARITHMIC AMPLIFIER HAVING COMPENSATION FOR TWO COMPONENTS OF TEMPERATURE INDUCED ERROR

Filed Feb. 17, 1966 2 Sheets-Sheet 1

INVENTORS
*Erik Dissing*
*Anders Gustaf Lyden*

BY *Pierce, Scheffler & Parker*
ATTORNEYS

Nov. 18, 1969 E. DISSING ET AL 3,479,593

CURRENT METER EMPLOYING A LOGARITHMIC AMPLIFIER HAVING COMPENSATION FOR TWO COMPONENTS OF TEMPERATURE INDUCED ERROR

Filed Feb. 17, 1966 2 Sheets-Sheet 2

INVENTORS

Erik Dissing

Anders Gustaf Lyden

BY Pierce, Scheffler & Parker

ATTORNEYS

United States Patent Office 3,479,593

Patented Nov. 18, 1969

3,479,593

CURRENT METER EMPLOYING A LOGARITHMIC AMPLIFIER HAVING COMPENSATION FOR TWO COMPONENTS OF TEMPERATURE INDUCED ERROR

Erik Dissing, Nykoping, and Anders Gustaf Lydén, Jakobsberg, Sweden, assignors to Aktiebolaget Atomenergi, Stockholm, Sweden, a corporation of Sweden Filed Feb. 17, 1966, Ser. No. 528,255
Claims priority, application Sweden, Feb. 19, 1965, 2,191/65
Int. Cl. G01r *1/30*
U.S. Cl. 324—123 1 Claim

ABSTRACT OF THE DISCLOSURE

A logarithmic current amplifier includes a feedback transistor between input and output and an output stage which includes two cascades of transistors connected as emitter followers. The first transistor in the first cascade is fed from the output of the amplifier and the first transistor of the second cascade is provided with an auxiliary transistor connected as a diode. The voltage of the auxiliary transistor is fed to the first transistor of the second cascade and the emitter of the diode connected transistor is fed by way of a resistor with an adjustable current for compensating a first component of the temperature drift of the feedback transistor. An instrument which measures the output current of the implifier is connected between the two cascades in series with a resistor having a suitably selected temperature coefficient for compensating a second component of the temperature drift of the feedback transistor.

The present invention relates to a logarithmic current amplifier having a transistor interposed in a feedback path from the amplifier output to the input, and especially but not exclusively to such a current amplifier for use in a dose rate meter.

In logarithmic amplifiers having a transistor in feedback path the difficulty is present that the transistor used for the feedback is temperature dependent and that a change of the temperature of the feedback transistor results in a parallel displacement as well as a change of the slope of the characteristic for said transistor.

A primary object of this invention is the provision of an output stage connected to the logarithmic current amplifier and arranged to compensate the parallel displacement as well as the change of the slope of the characteristic for said feedback transistor.

Figure 2:
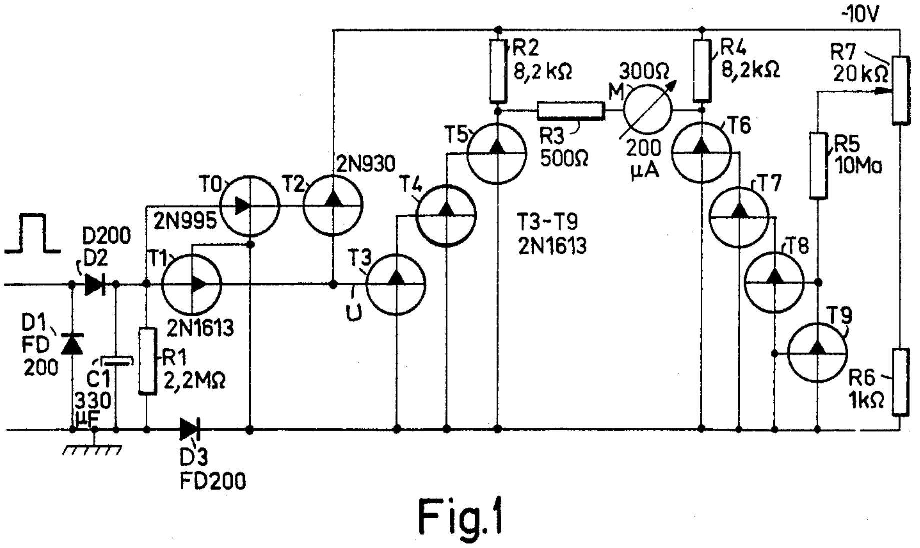
Figure 1:
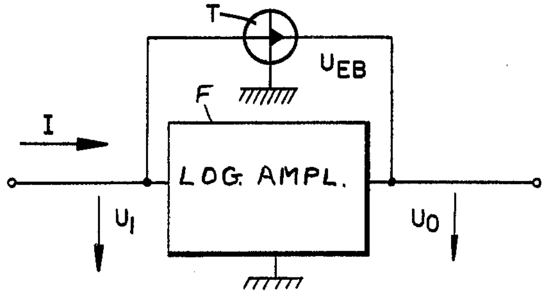
Figure 3:
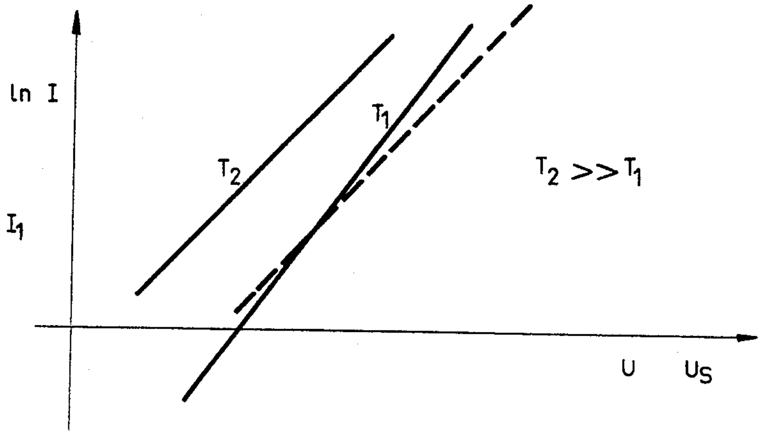
Figure 4:
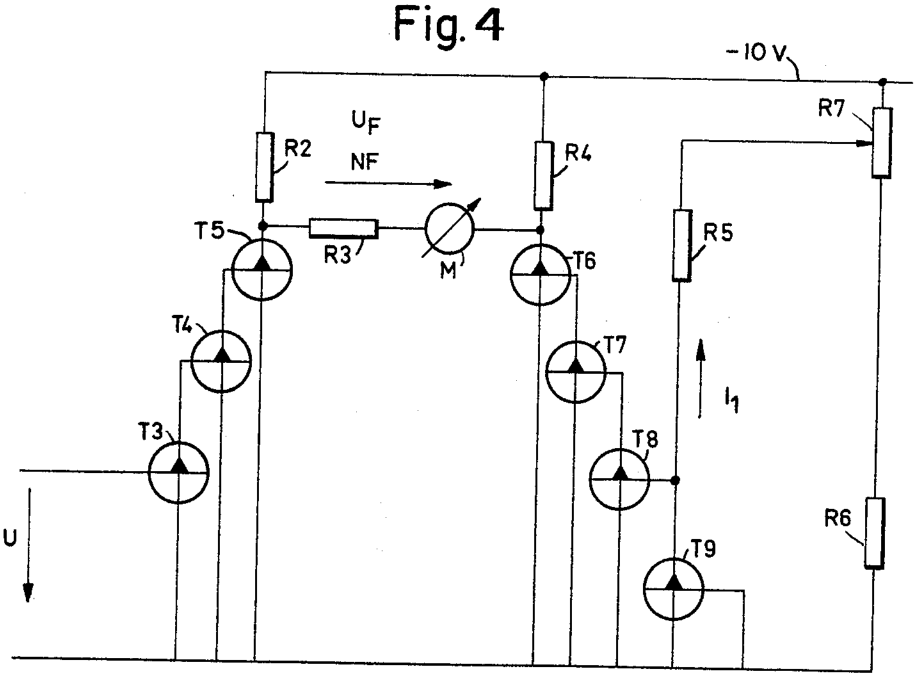

The invention is described in more detail by means of an exemplary embodiment together with the attached drawing. FIGURE 1 shows a logarithmic current amplifier with a transistor in feedback. FIGURE 2 is a detailed circuit diagram showing the logarithmic current amplifier together with the associated output stage, with values and types of components shown. FIGURE 3 shows the characteristic for the feedback transistor at two different temperatures. FIGURE 4 shows the output stage connected to the logarithmic current amplifier.

FIGURE 1 shows a logarithmic current amplifier with a transistor T in feedback path. The input current is denoted I, the input voltage $U_1$, the output voltage $U_0$, and the emitter-base-voltage $U_{EB}$. The amplifier has a gain F. If F has a large value the following relation is valid.

$$U_0 = U_{EB} = -(\ln I/I_0):\Omega$$

where $\Omega = q/KT$ ($K$=the Boltzmann constant; $q$=charge of the electron; T=absolute temperature).

FIGURE 2 is a detailed circuit diagram showing the logarithmic current amplifier, together with the associated output stage. In the embodiment shown, the logarithmic amplifier consists of two transistors T0 and T2 having the transistor T1 in feedback path. The transistors T0, T1 and T2 are here arranged to attain constant loop gain, which provides gain stabilization for increasing input currents.

From FIGURE 3 it is seen that a change of the temperature of the feedback transistor results in a parallel displacement of the transistor characteristic as well as a change of the slope of the characteristic. In order to compensate said temperature influence the output stage has been arranged in a special way shown in FIGURE 4; FIGURE 4 being a repetition of the part of FIGURE 2 showing the output stage. From FIGURE 4 it is seen that voltage U from the current amplifier is applied to a transistor T3 which is the first in a cascade of three stages connected as emitter followers and using the transistors T3, T4 and T5, said transistors all being NPN-transistors. The shown cascade of emitter followers has for an effect that the input to the cascade has a very high resistance and therefore is well suited for the output of the logarithmic current amplifier which for small values of I also shows a high resistance. However, the cascade of emitter followers shows a temperature drift and the characteristic value in this instance is 2.5 mv./° C. for each emitter follower. In order to compensate said drift, a cascade of three similar emitter followers with the transistors T6, T7 and T8 has been provided, and the measuring instrument M in series with a resistor R3 is connected to the emitter electrodes in the transistors T5 and T6, each of said emitter electrodes being connected to the −10 v. voltage supply line via resistors R2 and R4 respectively.

In order to compensate for the already mentioned parallel displacement of the characteristic of the feedback transistor T1 the cascade consisting of the transistors T6, T7 and T8 is supplied with the voltage from a transistor T9 connected as a diode, i.e. having its collector and base interconnected. The emitter of transistor T9 receives an adjustable current for compensation of said parallel displacement so that the working point will be the point in FIGURE 3 where the current is $I_1$. This adjustment is provided by a resistor R5 connected in series with the emitter in T9 and said resistor R5 is, in its turn, fed from the movable contact of a potentiometer R7 connected from the −10 v. voltage supply to the zero voltage point in series with a fixed resistor R6. In FIGURE 3 the dashed line shows the characteristic for the feedback transistor after the adjustment of the transistor T9 by means of the potentiometer R7 for compensation and also shows the voltage $U_S$ between the emitter electrodes in the transistors T5 and T6 as a function of the input current I. However, it is evident that the curve shown by the dashed line has a different slope than the slope for the transistor at the temperature $T_1$. This is due to a change with temperature of the Fermi-distribution of the mobile carriers in the transistors T1 and T9. A compensation of said slope difference is attained by selecting an appropriate positive temperature coefficient for the resistor R3 in series with the instrument M. In order to get this appropriate temperature coefficient for the total resistance connected between the transistors T5 and T6 it is possible to use a resistor with for instance a temperature coefficient of 0.0042/° C, which is that of copper together with a resistor showing practically zero temperature coefficient as the slope difference in FIGURE 3 represents a value of 0.0037/° C. (at 20° C.). In this connection it is important to note that the instrument M had a winding of copper wire and thus must be included in that portion of the total resistance which is to have positive temperature coefficient. For the resistor R3 in FIGURE 2 the temperature coefficient is a little smaller than the temperature coefficient for a resistor consisting of copper wire, and the resistor R3 is, in practice, built up with a portion of the resistance consisting of material with a temperature coefficient zero and the rest consisting of copper wire.

By means of the measures in the output stage now described it is possible to attain by simple means a compensation of the changes (drift) arising from a change of the temperature of the feedback transistor, which for all practical purposes is sufficient.

For a man skilled in the art it is also quite evident that an exchange of the shown transistor types to complemental types (for instance exchange of a PNP-transistor to a NPN-transistor) is possible by well known expedients such as changed supply voltages etc. and will produce the same beneficial results.

We claim:

1. In a logarithmic current amplifier device for supplying to a measuring instrument a quantitude corresponding to the logarithm of a supplied input current including a logarithmic amplifier unit having a plurality of transistors connected between an input and an output and a feedback transistor in a feedback path between the output and the input for amplifying an input current supplied to the input of said logarithmic amplifier unit, the improvement wherein said measuring instrument is arranged to be fed from the output stage of said logarithmic amplifier unit through a second amplifier unit comprising, a first cascade of transistors connected as emitter followers, a second cascade of transistors connected as emitter followers, a first transistor in the first cascade being fed from the output of the logarithmic amplifier, the first transistor of the second cascade being provided with an auxiliary transistor having its collector and base interconnected to function as a diode, a resistor arrangement and a source of power for applying an adjustable current through the auxiliary transistor, a first transistor in the second cascade being fed from the signal developed across the auxiliary transistor for compensation of a first component of the temperature drift of the feedback transistor, and a resistor having a suitably selected temperature coefficient for attaining a compensation of a second component of the temperature drift of said feedback transistor in series with the measuring instrument, wherein the resistor and measuring instrument in series are connected between the output of the first transistor cascade and the output of the second transistor cascade.

References Cited

UNITED STATES PATENTS

| | | | |
|---|---|---|---|
| 2,863,955 | 12/1958 | Keonjian | 330—20 |
| 2,999,169 | 9/1961 | Feiner | 307—230 |
| 3,153,203 | 10/1964 | Sem-Jacobsen et al. | 330—69 |
| 3,237,028 | 2/1966 | Gibbons. | |
| 3,273,060 | 9/1966 | Schneider | 324—123 XR |
| 3,307,101 | 2/1967 | Byles | 324—131 XR |
| 3,320,532 | 5/1967 | Watters | 324—123 |
| 3,361,975 | 1/1968 | Rorden et al. | 328—145 XR |

RUDOLPH V. ROLINEC, Primary Examiner

E. F. KARLSEN, Assistant Examiner

U.S. Cl. X.R.

324—105; 328—145